United States Patent [19]

Varadi et al.

[11] 4,379,259
[45] Apr. 5, 1983

[54] PROCESS OF PERFORMING BURN-IN AND PARALLEL FUNCTIONAL TESTING OF INTEGRATED CIRCUIT MEMORIES IN AN ENVIRONMENTAL CHAMBER

[75] Inventors: Andrew G. Varadi, Saratoga; Walid H. Maghribi, Milpitas, both of Calif.

[73] Assignee: National Semiconductor Corporation, Santa Clara, Calif.

[21] Appl. No.: 129,721

[22] Filed: Mar. 12, 1980

[51] Int. Cl.$^3$ .............................................. G01R 15/12
[52] U.S. Cl. ................................................. 324/73 AT
[58] Field of Search ........... 324/73 PC, 73 R, 73 AT, 324/158 F, 158 R; 365/201

[56] References Cited

U.S. PATENT DOCUMENTS

| | | |
|---|---|---|
| 3,039,604 | 6/1962 | Bichel et al. |
| 3,235,797 | 2/1966 | Boscia et al. |
| 3,344,351 | 9/1967 | Simonyan et al. |
| 3,345,567 | 10/1967 | Turner et al. |
| 3,408,565 | 10/1968 | Frick et al. |
| 3,412,333 | 11/1968 | Frick et al. |
| 3,492,572 | 1/1970 | Jones et al. |
| 3,609,547 | 9/1971 | Shusser |
| 3,656,058 | 4/1972 | Leathers |
| 3,704,418 | 11/1972 | Loffin |
| 3,710,251 | 1/1973 | Hagge et al. |
| 3,746,973 | 7/1973 | McMahon, Jr. |
| 3,761,808 | 9/1973 | Ryan |
| 3,781,683 | 12/1973 | Freed |
| 3,803,483 | 4/1974 | McMahon, Jr. |
| 3,842,346 | 10/1974 | Bobbitt |
| 3,956,698 | 5/1976 | Malmberg et al. |
| 3,979,671 | 9/1976 | Meeker et al. |
| 4,000,460 | 12/1976 | Kadakia et al. |
| 4,053,833 | 10/1977 | Malmberg et al. |
| 4,055,754 | 10/1977 | Chesley ................................ 365/201 |
| 4,145,620 | 3/1979 | Dice .................................. 324/73 PC |
| 4,168,527 | 9/1979 | Winkley |

Primary Examiner—Gerard R. Strecker
Assistant Examiner—Walter E. Snow
Attorney, Agent, or Firm—Brown & Martin

[57] ABSTRACT

A process performed by the manufacturer for testing integrated circuits (ICs) to insure better quality and higher reliability thereof and to eliminate the need for incoming inspection and board level testing by the chip customer. In the embodiment disclosed, in-process testing, wafer-probe testing, die separation, packaging, and one by one assembly line testing of the digital memory ICs for catastrophic failures all proceed according to conventional techniques. A large number of the ICs are then plugged into high-temperature, high signal integrity PC storage cards, each adapted for interconnecting the ICs in row-column arrays to form a memory board. The storage cards are mounted within an environmental chamber and are operatively coupled to corresponding PC driver cards mounted externally of the chamber. Next, accelerated dynamic burn-in of the ICs takes place. The PC storage cards are constructed to electrically isolate groups of the ICs so that if an IC in one group has a shorted input, the ICs in the remaining groups will still receive the appropriate dynamic signals to ensure burn-in thereof. Thereafter long functional/-pattern testing of the ICs with continuous error logging occurs while the ICs are still mounted in the chamber. Finally the PC storage cards are removed from the chamber and those ICs which have logged either hard or soft errors are separated. The remaining good ICs are subjected to one by one short functional testing to determine compliance with data sheet specs. After quality control testing, the good ICs are shipped to the chip customer who can safely assemble them into user systems without performing the usual customer level incoming inspection and board level testing.

4 Claims, 7 Drawing Figures

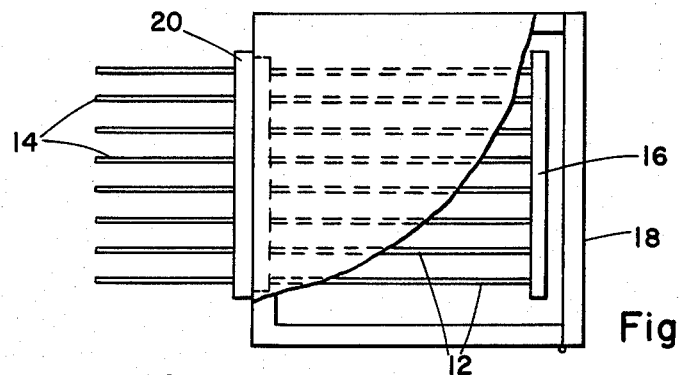
Fig. 5
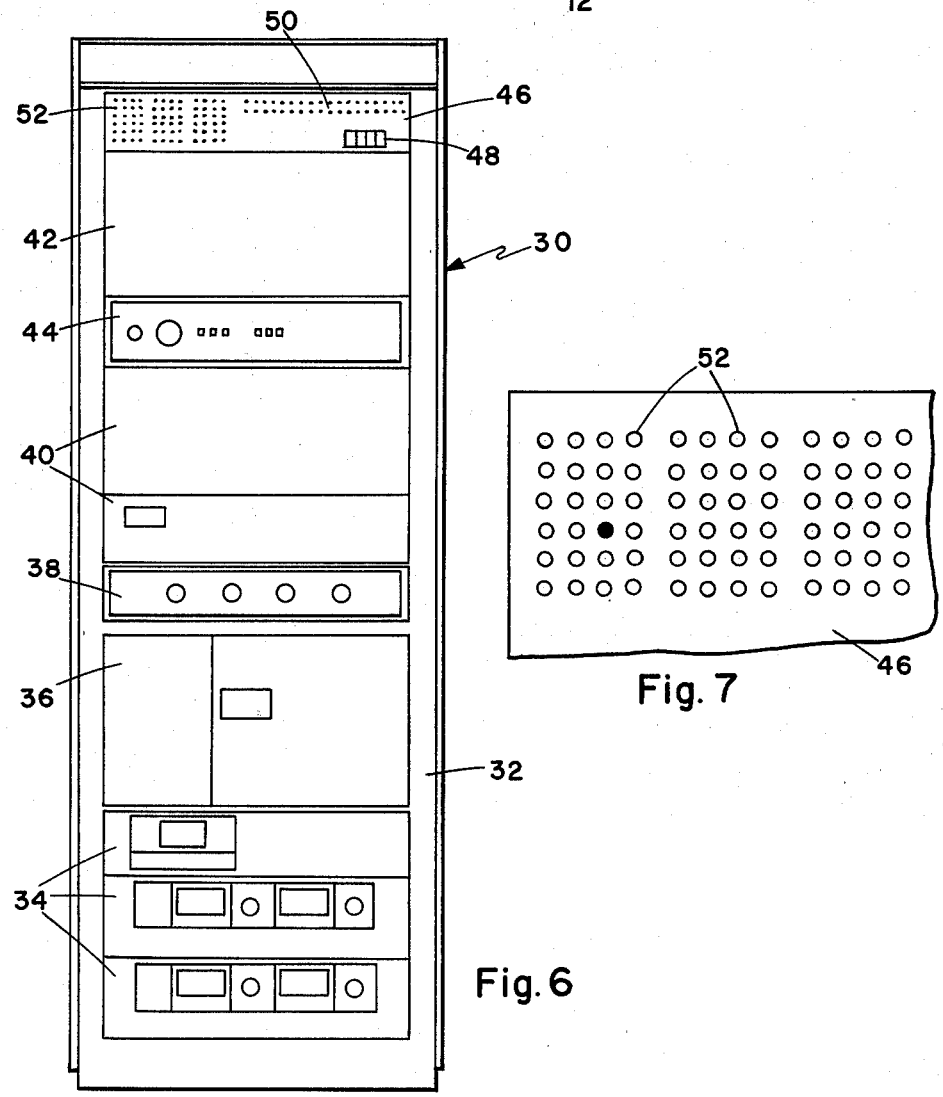
Fig. 7
Fig. 6

PROCESS OF PERFORMING BURN-IN AND PARALLEL FUNCTIONAL TESTING OF INTEGRATED CIRCUIT MEMORIES IN AN ENVIRONMENTAL CHAMBER

BACKGROUND OF THE INVENTION

The present invention relates to processes for testing integrated circuits, and more particularly, to a process performed by the chip maker for testing digital memory integrated circuits to insure better quality and higher reliability thereof and to eliminate the need for incoming inspection and board level testing by the chip customer. Hereafter, the term "ICs" will be used in place of the term "Integrated Circuits".

During manufacture by the chip maker ICs typically undergo three separate test cycles: (1) in-process testing, such as continuous monitoring of sheets resistivities, junction depths, and other pertinent device parameters, such as current gain and voltage breakdown; (2) a preliminary electrical testing called the wafer-probe test which is performed prior to the scribing and die separation steps; and (3) a detailed final testing of reliability and performance after the completion of the fabrication and packaging steps. The present invention relates to improvements in the last of these three types of testing. A summary of conventional techniques for testing ICs, both digital and linear, is set forth in an article written by Alan B. Grebene and Hans H. Stellrecht beginning at page 8-83 of the book entitled ELECTRONIC ENGINEER'S HANDBOOK, Copyright 1975, by McGraw-Hill, Inc.

The testing of ICs is one of the more expensive and time consuming stages of the manufacturing process. Automatic highspeed testing is practically mandatory to the final testing of modern ICs because a large number of complex tests are required to check even the simplest types of circuits. In addition, most chip customers who assemble the ICs into user systems such as mainframe computers and mini-computers also presently perform a substantial amount of testing of the ICs. It would be desirable to provide chip customers with ICs of significantly better quality and higher reliability than heretofore achieved with conventional chip maker performed final testing processes. This would result in considerable savings to the chip customer by substantially reducing the amount of customer testing required to insure that field failures and down time of systems incorporating such ICs do not exceed acceptably low levels. Further savings would also result to the chip customer because there would be a corresponding reduction in IC inventory throughput time. Such a chip maker performed final test process would have to provide ICs that have already operated in a system environment.

In order to provide a better understanding of the present invention a brief description of conventional testing of ICs by chip makers will be set forth. Thereafter, will follow a brief description of conventional testing of ICs by chip customers. The present invention is primarily intended for use with digital memory ICs, however, it should be understood that it may be extended to other forms of digital ICs as well as to linear ICs.

It is conventional during the final testing cycle to first test the ICs, one by one, for catastrophic failures caused by improper packaging, bonding, metallization, etc. Next the ICs are tested for operating reliability. To reduce the testing time that would otherwise be required under statistical analysis in order to demonstrate reliability with a high degree of confidence, accelerated life tests are typically used. Operation of the ICs for 168 hours at approximately 125° C. near the upper limits of their operating parameters has been accepted by the industry as an adequate test for removing infant mortality. The aforementioned reliability assurance is typically achieved during so-called burn-in of the ICs.

During conventional burn-in, a plurality of ICs are interconnected on high temperature PC boards which are mounted in an oven. Dynamic signals are then applied to each of the ICs through the PC boards to simulate operation. The temperature within the oven, the magnitude of the signals, and the duration of the burn-in are correlated to provide a statistically equivalent processing of 168 hours of operation at 125° C. Failures are accelerated by high temperature and high voltage stress conditions. Therefore, burn-in is a valuable testing step to determine whether the ICs are capable of operating on a long term basis.

After burn-in, it is conventional for the ICs to undergo a number of functional tests to evaluate their performance. One by one each IC is subjected to a series of long and short functional tests. The number and complexity of these functional tests varies from chip maker to chip maker. Long functional testing of digital memory ICs generally involves the pattern testing of each IC on an individual basis. Commonly used routines are checkerboard patterns of 1s and 0s or floating of a 1 or 0 from cell to cell while the adjacent cells are maintained in the opposite state. For larger memories, the generation of these test patterns requires a larger number of functional tests. Generally, the time required for adequate pattern testing increases at a rate which is proportional to the square of the number of bits of storage in the digital memory IC. As the bit storage capacity of a digital memory IC increases, the time required for adequate pattern testing increases at an exponential rate.

Short functional testing of ICs involves the testing of each IC on an individual basis to determine whether it meets the specs set down in the data sheet, e.g. operating speed, and voltage and current parameters. These so-called short functional tests generally require much less testing time than pattern testing. Both the long and short functional tests have heretofore been performed by chip makers in various sequences and at various temperature levels. However, functional testing by the chip maker has not heretofore been performed simultaneously on a large number of ICs.

After the functional tests are completed, the ICs that have satisfactorily undergone all tests are subjected to quality control testing. Sample units undergo one or more of the functional tests for a second time. Thereafter, all the good ICs are shipped to chip customers.

Many chip customers perform an incoming inspection of the ICs received prior to assembling them into user systems. Selected units are tested on an individual basis against data sheet specs, for example. Thereafter, in the case of digital memory ICs, it is common to subject them to board level testing prior to fabricating mainframe computer or mini-computer systems with the same. This involves the mounting of a plurality of digital memory ICs on a PC board in an array and electrically interconnecting them to form a memory board. Suitable drive electronics are usually also mounted on the memory board and are interconnected with the ICs. The memory board is usually coupled to a computer-controlled IC test system. Some chip customers insert these memory boards into a host system. This host system is one of the actual user systems of the type that the memory board will ultimately be inserted into and it has been dedicated for testing use only.

Board level testing is extremely important, because up until this point the system interaction capabilities of the digital memory ICs have not been tested. Single digital memory ICs will often pass all functional tests performed by the chip maker, however, when interacting with thousands of other similar ICs they may experience certain soft errors. A soft error is a random error that does not occur all of the time. Board level testing by chip customer permits the identification of any individual digital memory IC which experiences a single bit of failure due to noise, alpha particles, or marginality during several hours of system testing. These ICs are detected and replaced prior to insertion of the memory board into the ultimate computer system which is to be shipped to the user. Board level testing is thus very important in that it lowers costly down time of the computer system when in the hands of the user and it also reduces the cost of customer engineer calls associated therewith. However, a major portion of the board level testing is pattern testing which is costly and time consuming to perform and which undesirably increases IC inventory through put time.

After board level testing all of the good ICs are assembled into a user system. This system is frequently aged before undergoing a number of tests to verify that it operates as designed. Finally, many chip customers perform a quality control testing of the user systems prior to shipment thereof to the system users.

As previously mentioned, it would be desirable to provide customers with digital memory ICs of significantly better quality and higher reliability than heretofore achieved with conventional chip maker final testing processes. Eliminating the need for a substantial portion of the customer level testing of ICs would result in great economic savings to the chip customer.

In the past, burn-in has been performed by loading a large number of ICs into an oven and by applying dynamic signals to the individual ICs to simulate operating stress conditions at elevated temperatures. The PC boards into which the ICs have been plugged during burn-in have interconnected the ICs such that a defect in any one of the ICs could result in a failure to burn-in others. For example, if an input on a given IC has shorted, this has prevented the appropriate dynamic signals which create stress conditions from being applied to other ICs. These ICs which have not been burned in will often pass all functional tests only to experience an early life failure in a user system. It would be desirable, therefore, to provide a test process performed by the chip maker that would ensure that all ICs shipped to a customer have been burned-in.

In the past, at the chip maker level the system performance or interaction of the ICs has not been monitored in order to detect, for example, individual ICs which are subject to soft errors. Therefore, it would be desirable to provide a process performed by the chip maker of simultaneous or parallel testing a large number of digital memory ICs in board level fashion.

Heretofore, the transition from burn-in testing to functional testing by the chip maker has required the ICs to be loaded into and unloaded from an oven in bulk quantities, and thereafter loaded into and unloaded from a functional test apparatus in one by one fashion. Where the ICs have been functionally tested at different temperature levels, they have generally been loaded and unloaded from different functional test apparatus to eliminate the delay which would otherwise result in waiting for the temperature in a single test apparatus to stabilize at a new level. Thus, parallel burn-in of a large number of ICs followed by serial functional testing thereof has been conventional. While automated handler apparatus exist for facilitating one by one functional testing, such apparatus must be controlled and monitored by an operator whose labor cost must be figured into the sale price of the ICs. Furthermore, each handling step results in a certain percentage of damaged ICs.

If a final test process for digital memory ICs could be developed such that burn-in and long functional testing over a wide temperature range could be performed without handling the ICs inbetween, the chip maker's inventory time could be substantially reduced. In addition, considerable labor savings would result and the percentage of ICs damaged as a result of handling could be significantly reduced.

If the system interaction capability of digital memory ICs is to be tested by the chip maker, some method of limiting the time required for long functional or pattern testing would have to be devised. Large numbers of digital memory ICs, each having a relatively large bit storage capacity, would have to be simultaneously tested in parallel fashion.

U.S. Pat. Nos. 3,412,333; 3,609,547; and 3,656,058 disclose various mechanical apparatus designed for simultaneous burn-in of a plurality of ICs. U.S. Pat. No. 3,710,251 discloses a heat exchanger pedestal for holding a microelectronic circuit on a wafer or chip so that it can be electrically tested at both elevated and depressed temperatures. U.S. Pat. No. 3,761,808 discloses an environmental chamber and test apparatus for automatically performing electrical tests on a plurality of packaged integrated circuits in one by one fashion. U.S. Pat. No. 4,000,460 relates to pattern testing of a plurality of ICs mounted in an array on a PC board. U.S. Pat. Nos. 3,345,567; 3,746,973; 3,781,683; 3,803,483; and 3,842,346 relate to wafer-probe testing of integrated circuits. Finally, U.S. Pat. Nos. 3,039,604; 3,235,797; 3,334,351; 3,492,572; 3,704,418; 3,956,698; 3,979,671; 4,053,833; and 4,168,527 generally pertain to the field of testing of semiconductor devices.

SUMMARY OF THE INVENTION

The present invention provides a process performed by the manufacturer for testing ICs to insure better quality and higher reliability thereof and to eliminate the need for incoming inspection and board level testing by the chip customer. In the embodiment disclosed, in-processing testing, wafer-probe testing, die separation, packaging, and one by one assembly line testing of digital memory ICs for catastrophic failures all proceed according to conventional techniques. A large number of the ICs are then plugged into high-temperature, high signal integrity PC storage cards, each adapted for interconnecting the ICs in rowcolumn arrays to form a memory board. The storage cards are mounted within an environmental chamber and are operatively coupled to corresponding PC driver cards mounted externally of the chamber. Next, accelerated dynamic burn-in of the ICs takes place. The PC storage cards are constructed to electrically isolate groups of the ICs so that if an IC in one group has a shorted input, the ICs in the remaining groups will still receive the appropriate dynamic signals to ensure burn-in thereof. Thereafter long functional/pattern testing of the ICs with continuous error logging occurs while the ICs are still mounted in the chamber. Finally, the PC storage cards are removed from the chamber and those ICs which have logged either hard or soft errors are separated. The remaining good ICs are subjected to one by one short functional testing to determine compliance with data sheet specs. After quality control testing, the good ICs are shipped to the chip customer who can safely assemble them into user systems without performing the usual customer level incoming inspection and board level testing.

BRIEF DESCRIPTION OF THE DRAWINGS

FIG. 5 illustrates the loading of a plurality of the storage cards depicted in FIG. 3 into an environmental chamber with the associated driver cards depicted in FIG. 4 mounted externally, in accordance with the improved process illustrated in FIG. 2.

FIG. 6 is a front view illustrating the various components of a control unit which may be utilized to perform the improved process illustrated in FIG. 2.

FIG. 7 is an enlarged portion of the control unit of FIG. 6 showing a portion of the chip map utilized to display the location of defective ICs.

DESCRIPTION OF THE PREFERRED EMBODIMENT

Figure 1:
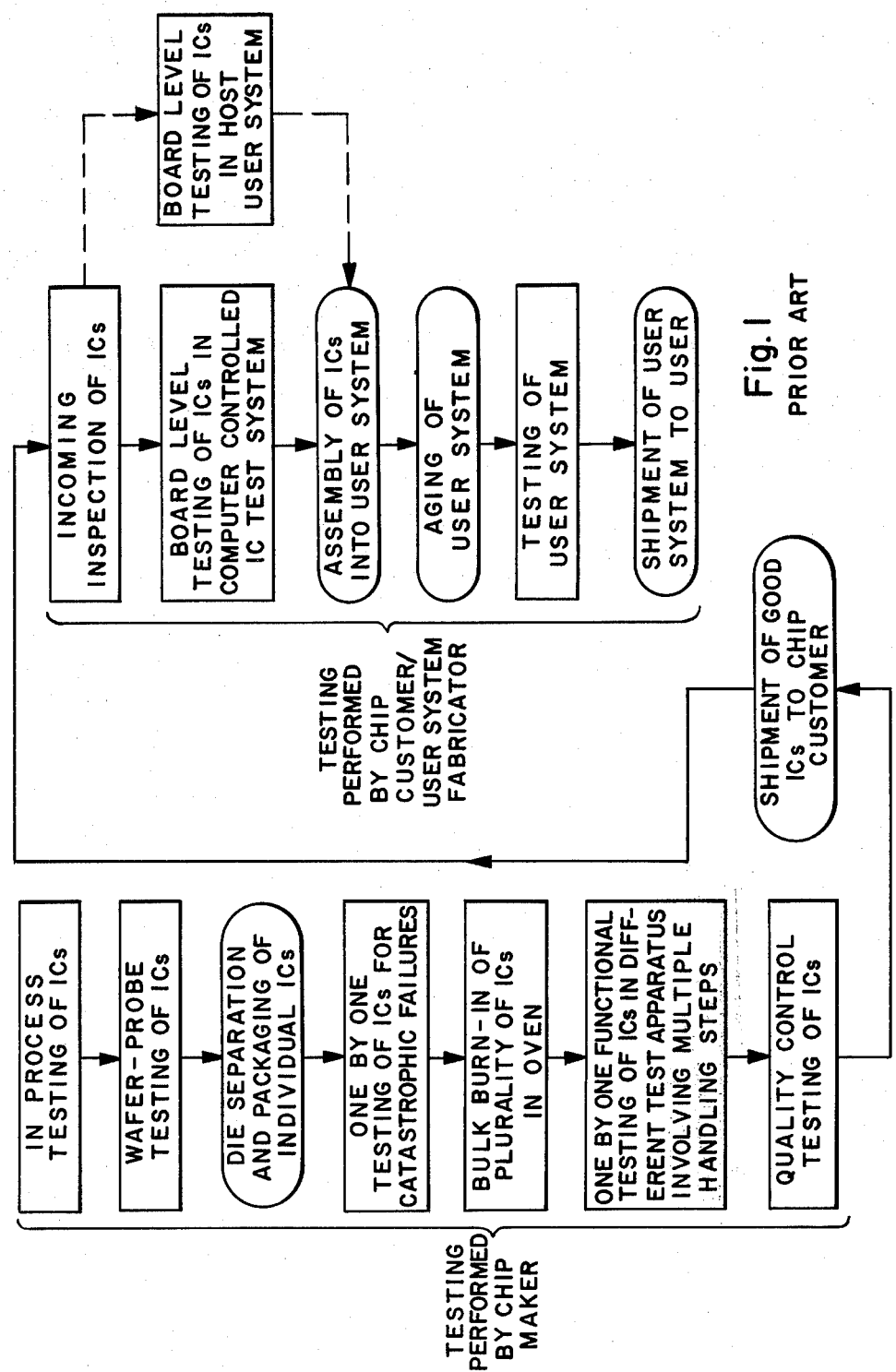
FIG. 1 is a flow diagram illustrating the conventional process for testing ICs.
Figure 2:
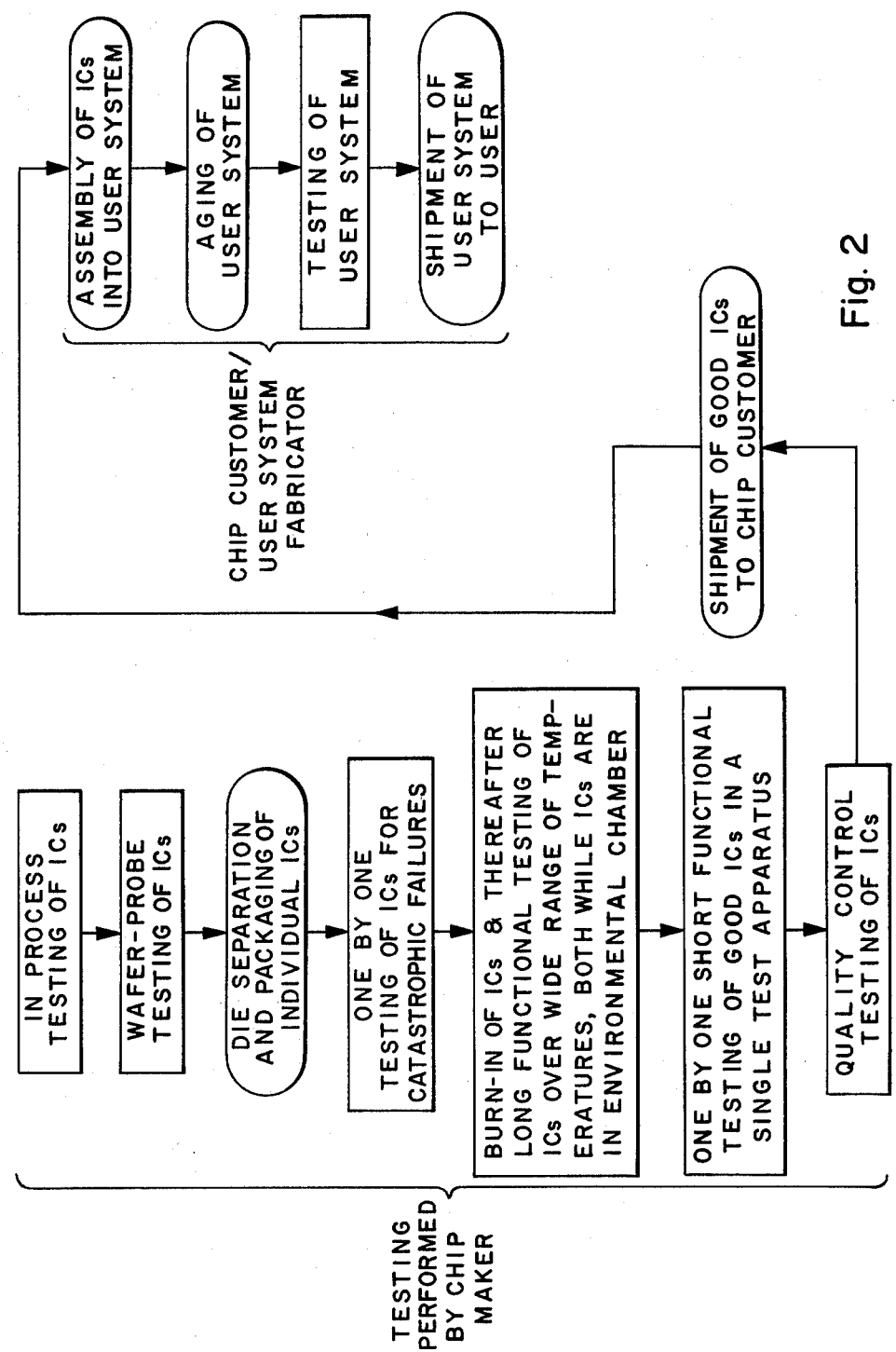
FIG. 2 is a flow diagram illustrating an improved process for testing ICs according to one embodiment of the present invention.

FIG. 1 is a flow diagram illustrating the conventional process for testing ICs which has been previously summarized. FIG. 2 is a flow diagram illustrating an improved process for testing ICs according to one embodiment of the present invention. A comparison of FIGS. 1 & 2 will yield a better understanding of the differences between the prior art process and the improved process of the present invention. In the flow diagrams, the boxes represent testing steps and the ovals represent non-testing steps. The flow diagram of FIG. 1 will not be further discussed since the steps of that conventional process have already been described. While the improved process of the present invention will be discussed in connection with digital memory ICs, it should be understood that it could be extended to other types of ICs, both digital and linear. The improved process has been successfully tested with 16K dynamic RAMs.

Turning now to FIG. 2, in-process testing of the digital memory ICs and thereafter wafer-probe testing of the ICs both proceed according to conventional techniques. The same is also true for die separation and packaging of individual ICs and then one by one rapid assembly line testing of the ICs for catastrophic failures.

Next, the ICs such as 10 (FIG. 3) are manually plugged into PC storage cards such as 12, each adapted for interconnecting the ICs in row-column arrays to form a memory board. Until otherwise indicated, the following discussion will focus on the broad aspects of various hardware needed to perform the improved process of the present invention. The PC storage card illustrated in FIG. 3 holds a 6×12 array of digital memory ICs such as 16K dynamic RAMs. The environmental chamber hereafter described, which is utilized for burn-in, preferably has the capacity for having mounted therein a relatively large number of the storage cards. In a prototype system actually constructed, the chamber was designed to hold 64 PC storage cards, each holding 72 ICs for a total of 4,608 ICs. This represents a 9 megabyte memory system when 16K dynamic RAMs are utilized.

According to the improved process of the present invention, pattern testing of the ICs occurs over a wide temperature range while they are still plugged into the storage cards mounted within the environmental chamber. The PC storage cards such as 12 are constructed of heat resistant materials so that they have a high-temperature resistance. In addition, the PC storage cards are constructed so that they can provide a high level of signal integrity which is on par with that achieved in the PC memory boards of the user systems. Therefore, the PC storage cards preferably have a multilayer construction, including ground planes, bypassing elements, etc. in order to achieve sufficient signal integrity to permit long functional or pattern testing of a plurality of the ICs while they are still in the environmental chamber. This is to be contrasted with the construction of a PC board utilized for conventional chip maker performed burn-in. Those PC boards need not be constructed to provide high signal integrity since dynamic signals are applied to the ICs only to generate stress conditions and not for the purpose of pattern testing.

The drive electronics 13 (FIG. 4) necessary to permit pattern testing of the ICs 10 on the PC storage cards are mounted on separate PC driver cards such as 14. Both power supply levels and logic levels, supplied to the ICs on the storage cards can be changed by substituting different driver cards. As illustrated in FIG. 5, the PC storage cards 12 are vertically loaded into racks 16 within an environmental chamber 18. This chamber is adapted for maintaining precise elevated temperatures therein. Preferably it is also adapted for maintaining precise temperatures therein below ambient temperature. The driver cards 14, one corresponding to each of the storage cards, are loaded vertically into racks 20 behind the back panel of the chamber. The edge contacts 22 (FIG. 3) of each of the storage cards project through a corresponding slot (not illustrated) in the back panel of the chamber and are electrically coupled to the edge contact structure 24 (FIG. 4) of a corresponding driver card as shown by the general relationship of the cards in FIG. 5. These couplings have associated gaskets or or other structure so that they are airtight. This permits the ICs 10 on the storage cards to be operated at elevated or reduced temperatures within the chamber while the drive electronics on the driver cards remain at ambient temperature. This is important since only the ICs on the storage cards are to be tested at various temperatures and normal operation of the drive electronics is desired. The structure of the chamber 18 may otherwise be conventional. After the storage cards 12 are all loaded, the door of the chamber is closed and secured. The driver cards form part of the test apparatus and are plugged in when the system is initially assembled. The driver cards thereafter remain mounted as batch after batch of ICs are processed within the chamber.

Thus, to repeat, each of the PC storage cards containing the ICs which are to be tested has its own driver card. Only the storage cards operate in the elevated temperature environment within the chamber 18. The driver cards 14 project outwardly from the back of the chamber and operate at room temperature throughout the test cycle. This architecture assures signal integrity to and from the digital memory ICs on the storage cards over the entire temperature range during the various long functional tests hereafter described.

Figure 3:
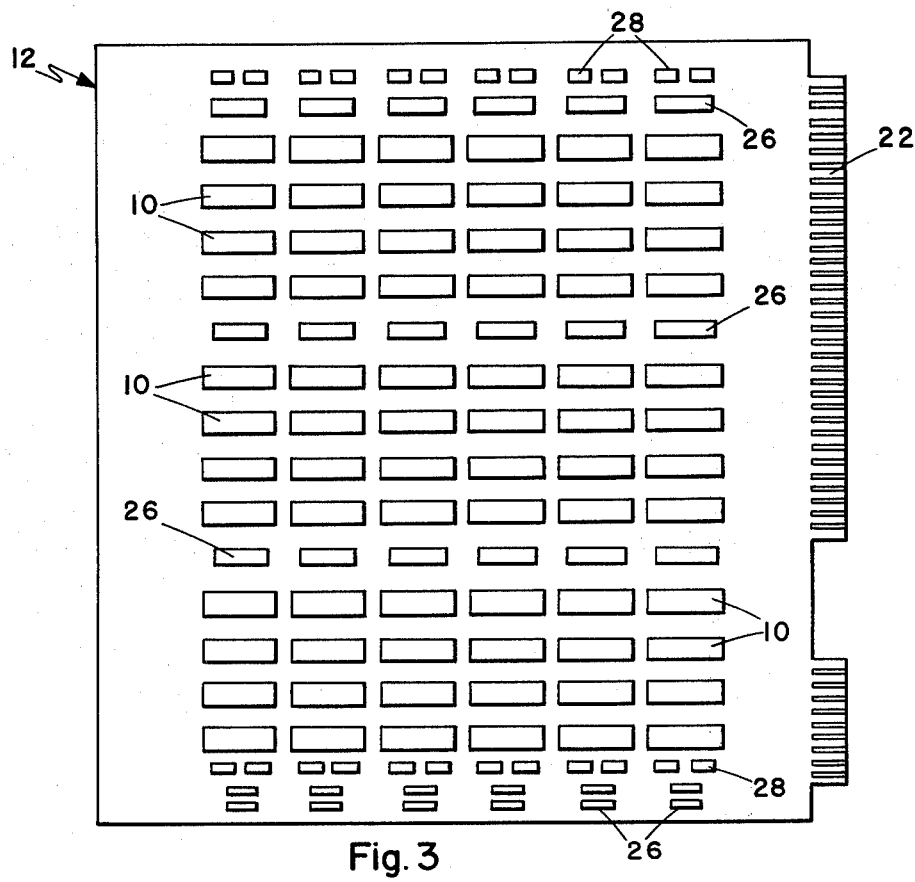
FIG. 3 is a plan view of one embodiment of a PC storage card which may be utilized for holding an array of ICs in order to perform the improved process illustrated in FIG. 2.
Figure 4:
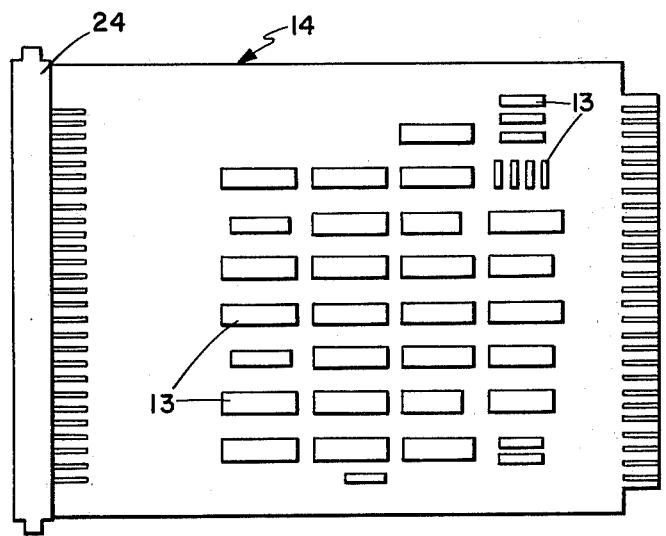
FIG. 4 is a plan view of one embodiment of a PC driver card which may be utilized in order to perform the improved process illustrated in FIG. 2.

Referring again to FIG. 3, the ICs 10 on each of the storage cards 12 are subdivided into small groups which are electronically isolated by resistors such as 26. If, during testing, an IC in one group exhibits an input short, the remaining ICs in the other groups will still receive the appropriate dynamic signals to ensure burn-in thereof. The non-defective ICs in the one group which may not have been subjected to burn-in are later identified and recycled for burn-in with a later batch. In FIG. 3, the 72 ICs on the storage card 12 are divided into 18 groups of 4 ICs each. In addition, the various groups of ICs on the storage cards are electically interconnected with capacitors 28 which are necessary in order to simulate a system environment for board level testing.

The environmental chamber, the PC storage cards, and the PC driver cards are operatively connected to a control unit generally designated 30 (FIG. 6). This control unit includes a vertical rack 32 having mounted therein various electronic devices which are utilized to perform the testing and error logging operations hereafter described. Mounted within the rack of the control unit are remotely programmed precision power supplies 34, a digital volt meter 36, an automatic voltage margin control 38, a firmware ROM based pattern generator 40, and a real time error logger 42. The components of the control unit just described are commercially available in various configurations from such manufacture as Fairchild and Teledyne.

The control unit 30 further includes an operator control panel 44 from which the operator can control the pattern generator, chamber temperature, error logging, etc. Thus the ICs can be subjected to arbitrary preprogrammed temperatures, supply voltages and patterns. Finally, the control unit an error log display 46, an enlarged portion of which is illustrated in FIG. 7. The error log display 46 includes an alphanumeric LED clock 48 which displays timing information relative to the error logging. At the conclusion of the testing operations involving the use of the environmental chamber 18 and the control unit 30, the real time error logging information which has been tabulated with the error logger 42 is played back. The ICs which have been logged in a single bit error (either a hard or soft error) at any time can be identified by observing the display 46. As this information is played back, each PC storage card is successively referenced by the illumination of a corresponding single one of 64 lamps in a card map 50, there being one such lamp uniquely identifying each of the 64 PC storage cards. As each storage card is referenced various ones of a second set of lamps in a chip map 52 are illuminated to show which of the ICs on the particular storage card indicated by the card map 50 have logged an error. The number of lamps in the chip map 52 is equal to the number of ICs on each one of the storage cards. These chip map lamps are arranged in an array of the same size as the array of ICs on the storage cards. Illumination of one or more of the lamps thus gives the operator a visual indication of the actual location of the bad ICs on the particular storage card being referenced. This permits the bad ICs to be sorted out during depopulation of each one of the storage cards. Thus, in FIG. 7, the darkened one of the lamps in the chip map 52 indicates that a particular PC storage card has a bad chip at the intersection of the third column and the fourth row.

Returning now to a description of the improved process of the present invention, after all of the ICs which are to be tested (4608 in the example given) have been loaded into the chamber 18, they are given an initial functional test. This initial functional test consists of a selected short duration pattern testing of the ICs to verify that all of the ICs on the storage cards now comprise in combination a functioning memory system. This may be accomplished at a temperature approximating room temperature, e.g. 25° C. At this stage the objective is to correct defects due to bent pins of the ICs, reversed ICs, etc. By way of example, this portion of the test may take approximately 5 seconds or less.

With the door of the chamber closed, the controls on the panel 44 are operated to commence an accelerated dynamic burn-in of the ICs at a first predetermined elevated temperature. Preferably, in accordance with industry standards the magnitude of the temperature within the chamber, the magnitude of the dynamic signals supplied to the digital memory ICs, and the duration of this portion of the test are correlated in order to achieve the effects of 168 hours of operation at approximately 125° C. This precipitates early life failures, or so-called infant mortalities. If an IC has an input short, the burn-in of the remaining ICs in other groups proceeds because of the isolation resistors 26 on the PC storage cards 12.

Upon the conclusion of the accelerated dynamic burn-in, the operator once again adjusts the controls on the control panel 44 so that the temperature within the chamber drops to a second predetermined temperature, e.g. 70° C. The operator then manipulates the pattern generator 40 and the error logger 41 in order to commence the long functional or pattern testing and the error logging of the digital memory ICs within the chamber. The long functional testing continues for a standard time, typically several hours, during which the digital memory ICs are tested at all voltage corners with specified patterns. In the prototype actually constructed, up to nine test patterns may be selected with power supplies being automatically varied for margin testing. Several cell disturb patterns may be selected.

After a specified time period of long functional testing at the second predetermined temperature the operator once again manipulates the controls on the control panel 44 so that the chamber will gradually cool to ambient or room temperature. During this cooling, pattern testing of the ICs continues with continuous error date logging. In the prototype actually constructed, this portion of the long functional testing may take, for example, an additional hour. If desired, the controls on the panel 44 may then be operated to lower the temperature in the chamber to a third predetermined temperature below ambient temperature. Continuous pattern testing and error logging proceeds.

Thus, it will be observed that burn-in and parallel long functional testing of a large number of ICs is accomplished with a minimum of chip handling. Labor costs are reduced along with the rate of damaged chips due to handling. The long functional testing performed while the ICs are in the chamber effects board level testing, i.e. a testing of the system interaction capabilities of the ICs.

At the conclusion of the long functional testing, the storage cards are removed from the environmental chamber. ICs with logged hard or soft errors are separated from the good ICs as the boards are depopulated. This is done during the playback of the error logging information and by observing the information displayed by the card map 50 and the chip map 52 as previously described in connection with the explanation of FIGS. 6 and 7. Apparently good ICs in a group wherein an IC has suffered an input short may be routed for re-testing to insure burn-in thereof. The remaining good ICs now undergo short functional testing, one by one, in a single conventionally available test apparatus. Preferably they are tested against data sheet specifications. As an example, in the test of the improved process which was actually performed, the ICs were tested at this point with plus or minus 12.5% supply voltage margins in a closed environment having an infrared controlled case temperature of approximately 85° C. Short functional testing of individual ones of the ICs takes only a very short time, e.g. approximately one second per IC. Only one handling of the ICs is required here, since contrary to the conventional process, multiple loading and unloading into different single chip test apparatus is not required. Finally, the chip maker's testing cycle may conclude by subjecting the ICs which have successfully undergone all tests to date to optional quality control testing. Then the good chips are shipped to the chip customers.

As indicated in FIG. 2, ICs which have undergone the improved test of the present invention can be directly assembled by the chip customer into user systems without the need for either incoming inspection or board level testing by the chip customer. After aging of the user systems, the systems may be tested by the chip customer before shipment. While there still may be some ICs that fail in the user system environment, the frequency of such failures is substantially reduced by the improved test process of the present invention.

Having described a preferred embodiment of our improved process for testing ICs, it should be apparent to those skilled in the art that the process permits of modification in arrangement and detail. Therefore our invention should be limited only in accordance with the scope of the following claims.

We claim:

1. A process for testing a plurality of digital memory ICs comprising:
    plugging the ICs into PC storage cards each adapted for interconnecting the ICs in row-column arrays to form a memory board, the storage cards being constructed to have high temperature resistance and high signal integrity;
    loading the storage cards into an environmental chamber and operatively coupling a PC driver card to each of the storage cards, the driver cards being mounted outside the chamber and having drive electronics for enabling pattern testing of the ICs on each of the storage cards;
    subjecting the ICs to short duration pattern testing to verify that the ICs function in combination as a memory system;
    elevating the temperature within the chamber and applying dynamic signals to the ICs to accomplish accelerated dynamic burn-in thereof; and
    subjecting the ICs to parallel long functional testing while still in the chamber, including pattern testing of the ICs over a predetermined range of temperatures to determine the system interaction capabilities of the ICs, and logging hard and soft errors exhibited by individual ones of the ICs.

2. A process according to claim 1 wherein the ICs on each of the storage cards are separated into a plurality of groups which are electrically isolated from each other so that a short occuring in a selected one of the ICs in a selected one of the groups will not prevent burn-in of the ICs in the remaining ones of the groups.

3. A process according to claim 1 wherein during the burn-in step, the magnitude of the temperature within the chamber, the magnitude of the dynamic signals applied to the ICs, and the duration of the burn-in are correlated to provide a statistically equivalent processing of approximately 168 hours of operation at approximately 125° C.

4. A process according to claim 1 wherein the long functional testing step takes place while supply voltages applied to the ICs are varied.

* * * * *